US012604447B1

(12) United States Patent
Kim

(10) Patent No.: US 12,604,447 B1
(45) Date of Patent: Apr. 14, 2026

(54) DISPLAY DEVICE

(71) Applicant: LG Display Co., Ltd., Seoul (KR)

(72) Inventor: JinWoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/075,179

(22) Filed: Mar. 10, 2025

(30) Foreign Application Priority Data

Feb. 14, 2025 (KR) ......................... 10-2025-0019229

(51) Int. Cl.
        *H05K 9/00*        (2006.01)
        *G09G 3/20*        (2006.01)
        *H10K 59/95*       (2023.01)
(52) U.S. Cl.
        CPC ......... *H05K 9/0024* (2013.01); *G09G 3/2092* (2013.01); *H05K 9/0054* (2013.01); *H10K 59/95* (2023.02); *G09G 2330/04* (2013.01)
(58) Field of Classification Search
        CPC .. H05K 9/0024; H05K 9/0054; G09G 3/2092; G09G 2330/04; H10K 59/95
        See application file for complete search history.

(56) References Cited

U.S. PATENT DOCUMENTS

| | | | |
|---|---|---|---|
| 8,648,851 B2 | 2/2014 | Lee | |
| 2010/0123710 A1* | 5/2010 | Lee | G09G 3/2092 |
| | | | 345/87 |
| 2017/0094779 A1* | 3/2017 | Go | H05K 1/0201 |

FOREIGN PATENT DOCUMENTS

| | | |
|---|---|---|
| KR | 10-2022-0163316 A | 12/2022 |
| KR | 10-2722624 B1 | 10/2025 |

* cited by examiner

*Primary Examiner* — Chanh D Nguyen
*Assistant Examiner* — Gloryvid Figueroa-Gibson
(74) *Attorney, Agent, or Firm* — Fenwick & West LLP

(57) ABSTRACT
A display device may include a display panel on which a plurality of subpixels are disposed and an image is displayed, a source driving integrated circuit that supplies a data voltage to the plurality of subpixels, a source film connected to the display panel and on which the source driving integrated circuit is disposed, a printed circuit board that overlaps with at least a portion of the source film, a circuit block that is disposed on the printed circuit board and controls a voltage or current for driving the display panel, a shield can that overlaps with the printed circuit board and the circuit block, a shield tape that overlaps with at least a portion of the shield can and the source film and protects the source film, and a reinforcing member that overlaps with a rear surface of the shield tape along a length direction of the shield tape.

18 Claims, 15 Drawing Sheets

300

310

320

300

300

DISPLAY DEVICE

CROSS REFERENCE TO RELATED APPLICATION

This application claims priority from Republic of Korea Patent Application No. 10-2025-0019229, filed on Feb. 14, 2025, which is hereby incorporated by reference in its entirety.

TECHNICAL FIELD

Embodiments of the present disclosure relate to a display device.

BACKGROUND

As the information society develops, there is an increase in the demand for display devices for displaying images, and various types of display devices such as liquid crystal display devices and organic light emitting display devices are being utilized.

Among these display devices, the organic light emitting display device has advantages in terms of fast response speed, contrast ratio, luminance efficiency, brightness, and viewing angle by using organic light emitting diodes with self-luminous characteristics.

The organic light emitting display device may include an organic light emitting diode arranged in each of a plurality of subpixels arranged on a display panel and may control the brightness of each subpixel by controlling the current flowing through the organic light emitting diode to emit light, thereby displaying an image.

The display device requires various circuits for transmitting voltage to the plurality of subpixels. The various circuits can stably supply the voltage required for the plurality of subpixels by being arranged together with components for being protected from external electromagnetic or shock.

SUMMARY

Embodiments of the present disclosure may provide a display device that is robust to the stresses occurring during the process of attaching a shield tape for protecting a source film.

Embodiments of the present disclosure may provide a display device that is robust to contamination due to exposure to adhesive material applied to the source film.

The objects of the embodiments of the present disclosure are not limited to the objects described in this specification, and other objects not mentioned will be clearly understood by those skilled in the art from the description below.

Embodiments of the present disclosure may provide a display device including a display panel on which a plurality of subpixels are disposed and an image is displayed, a source driving integrated circuit that supplies a data voltage to the plurality of subpixels, a source film connected to the display panel and on which the source driving integrated circuit is disposed, a printed circuit board that overlaps with at least a portion of the source film, a circuit block that is disposed on the printed circuit board and controls a voltage or current for driving the display panel, a shield can that overlaps with the printed circuit board and the circuit block, and a shield tape that overlaps with the source film, at least a portion of the printed circuit board, and at least a portion of the shield can and protects the source film, wherein the shield tape includes a protrusion overlapping with at least a portion of the shield can, and a step portion formed on both sides of the protrusion to distribute stress.

Embodiments of the present disclosure may provide a display device including a display panel on which a plurality of subpixels are disposed and an image is displayed, a source driving integrated circuit that supplies a data voltage to the plurality of subpixels, a source film connected to the display panel and on which the source driving integrated circuit is disposed, a printed circuit board that overlaps with at least a portion of the source film, a circuit block that is disposed on the printed circuit board and controls a voltage or current for driving the display panel, a shield can that overlaps with the printed circuit board and the circuit block, a shield tape that overlaps with at least a portion of the shield can and the source film and protects the source film, and a reinforcing member that overlaps with a rear surface of the shield tape along a length direction of the shield tape.

According to the embodiments of the present disclosure, it is possible to provide a display device capable of minimizing or at least reducing tearing of a shield tape protecting a source film due to stress.

According to the embodiments of the present disclosure, it is possible to provide a display device capable of optimizing a process by forming a reinforcing member and a contamination prevention member on a rear surface of a shield tape with the same material.

The effects of the embodiments of the present disclosure are not limited to the effects mentioned above, and other effects not mentioned will be clearly understood by those skilled in the art from the description of the claims.

BRIEF DESCRIPTION OF THE DRAWINGS

The present disclosure will be more fully understood from the detailed description and accompanying drawings provided below, which are provided for illustration only and are not intended to limit the present disclosure.

DETAILED DESCRIPTION

Figure 1:
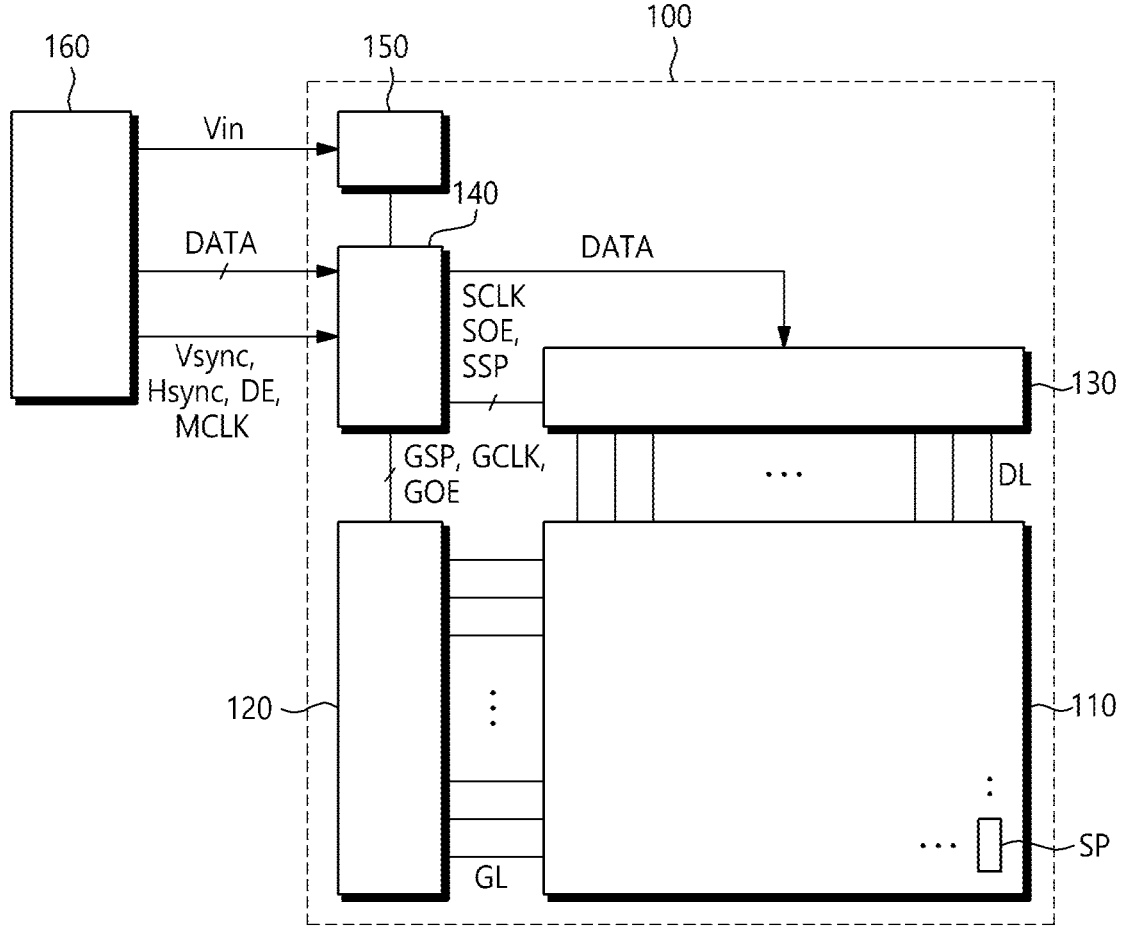
FIG. 1 is a system diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, it will be described various embodiments of the disclosure in detail with reference to the accompanying drawings.

FIG. 1 is a system diagram of a display device 100 according to embodiments of the present disclosure.

Referring to FIG. 1, a display device 100 according to an embodiment of the present disclosure may include a display panel 110 in which a plurality of gate lines GL and data lines DL are connected and a plurality of subpixels SP are arranged in a matrix form, a gate driving circuit 120 for driving a plurality of gate lines GL, a data driving circuit 130 for supplying data voltages through a plurality of data lines DL, a controller 140 for controlling the gate driving circuit 120 and the data driving circuit 130, and a power management circuit 150.

The display panel 110 displays an image based on a scan signal and a light emission control signal transmitted from a gate driving circuit 120 through a plurality of gate lines GL and a data voltage transmitted from a data driving circuit 130 through a plurality of data lines DL.

In the case of a liquid crystal display, the display panel 110 includes a liquid crystal layer formed between two substrates and may be operated in any known mode such as a TN (Twisted Nematic) mode, a VA (Vertical Alignment) mode, an IPS (In-Plane Switching) mode, or an FFS (Fringe Field Switching) mode. Meanwhile, in the case of an organic light emitting display, the display panel 110 may be implemented in a top emission mode, a bottom emission mode, or a dual emission mode.

The display panel 110 may have a plurality of pixels arranged in a matrix form, and each pixel may be composed of subpixels SP of different colors, for example, white subpixels, red subpixels, green subpixels, and blue subpixels, and each subpixel SP may be defined by a plurality of data lines DL and a plurality of gate lines GL.

One subpixel SP may include a thin film transistor (TFT) formed in an area where one data line DL and one gate line GL intersect, a light emitting device such as an organic light emitting diode charging a data voltage, a storage capacitor electrically connected to the light emitting device to maintain the voltage, etc.

The gate driving circuit 120 is controlled by the controller 140 and controls the driving timing for a plurality of subpixels SP by sequentially outputting scan signals to a plurality of gate lines GL arranged on the display panel 110.

In this case, the gate driving circuit 120 may include one or more gate driving integrated circuits GDIC and may be located only on one side of the display panel 110 or on both sides depending on the driving method. Alternatively, the gate driving circuit 120 may be built into a bezel area of the display panel 110 and implemented in the form of a GIP (Gate-In-Panel).

The data driving circuit 130 receives image data DATA from the controller 140 and converts the received image data DATA into an analog data voltage. Then, the data driving circuit 130 outputs the data voltage to each data line DL in accordance with the timing at which the scan signal is applied through the gate line GL, and each subpixel SP connected to the data line DL displays a light emission signal of brightness corresponding to the data voltage.

Similarly, the data driving circuit 130 may include one or more source driving integrated circuits SDIC, and the source driving integrated circuit SDIC may be connected to bonding pads of the display panel 110 using a tape automated bonding (TAB) method or a chip-on-glass (COG) method or may be directly disposed on the display panel 110.

One side of the source film may be electrically connected to the display panel 110. In addition, wires for electrically connecting the source driving integrated circuit SDIC and the display panel 110 may be arranged on the upper part of the source film.

In some cases, each source driving integrated circuit SDIC may be integrated and arranged on the display panel 110. In addition, each source driving integrated circuit SDIC may be implemented in a chip-on-film (COF) manner, and in this case, each source driving integrated circuit SDIC may be mounted on the source film and electrically connected to the data line DL of the display panel 110 through the source film. The source driving integrated circuit SDIC may supply a data voltage to the display panel 110.

The controller 140 supplies various control signals to the gate driving circuit 120 and the data driving circuit 130 and controls the operation of the gate driving circuit 120 and the data driving circuit 130. That is, the controller 140 controls the gate driving circuit 120 to output a scan signal according to the timing implemented in each frame and transmits image data DATA received from the outside to the data driving circuit 130.

In this case, the controller 140 receives various timing signals including a vertical synchronization signal (Vsync), a horizontal synchronization signal (Hsync), a data enable signal (DE), a main clock (MCLK) along with the image data DATA from an external host system 160.

The host system 160 may be any one of a television system, a set-top box, a navigation system, a personal computer (PC), a home theater system, a mobile device, and a wearable device.

Accordingly, the controller 140 generates a control signal using various timing signals received from the host system 160 and transmits the control signal to the gate driving circuit 120 and the data driving circuit 130.

For example, the controller 140 outputs various gate control signals including a gate start pulse (GSP), a gate clock (GCLK), a gate output enable signal (GOE) in order to control the gate driving circuit 120. Here, the gate start pulse (GSP) controls the timing at which one or more gate driving integrated circuits GDIC constituting the gate driving circuit 120 start operating. In addition, the gate clock (GCLK) is a clock signal commonly input to one or more gate driver integrated circuits GDICs and controls the shift timing of the scan signal. In addition, the gate output enable signal (GOE) specifies the timing information of one or more gate driver integrated circuits GDICs.

In addition, the controller 140 outputs various data control signals including a source start pulse (SSP), a source sampling clock (SCLK), a source output enable signal (SOE) in order to control the data driver circuit 130. Here, the source start pulse (SSP) controls the timing at which one or more source driver integrated circuits SDICs constituting the data driver circuit 130 start data sampling. The source sampling clock (SCLK) is a clock signal that controls the timing at which data is sampled in the source driver integrated circuit SDIC. The source output enable signal (SOE) controls the output timing of the data driving circuit 130.

The display device 100 may include a power management circuit 150 that supplies various voltages or currents to the display panel 110, the gate driving circuit 120, the data driving circuit 130, or controls various voltages or currents to be supplied.

The power management circuit 150 adjusts the direct-current (DC) input voltage Vin supplied from the host system 160 to generate power required for driving the display panel 110, the gate driving circuit 120, and the data driving circuit 130.

Meanwhile, the subpixel SP is located at the point where the gate line GL and the data line DL intersect, and a light emitting device may be disposed in each subpixel SP. For example, an organic light emitting display device includes a light emitting device such as an organic light emitting diode in each subpixel SP, and can display an image by controlling the current flowing to the light emitting device according to the data voltage.

The display device 100 may be various types of devices such as a liquid crystal display, an organic light emitting display, and a plasma display panel.

Figure 2:
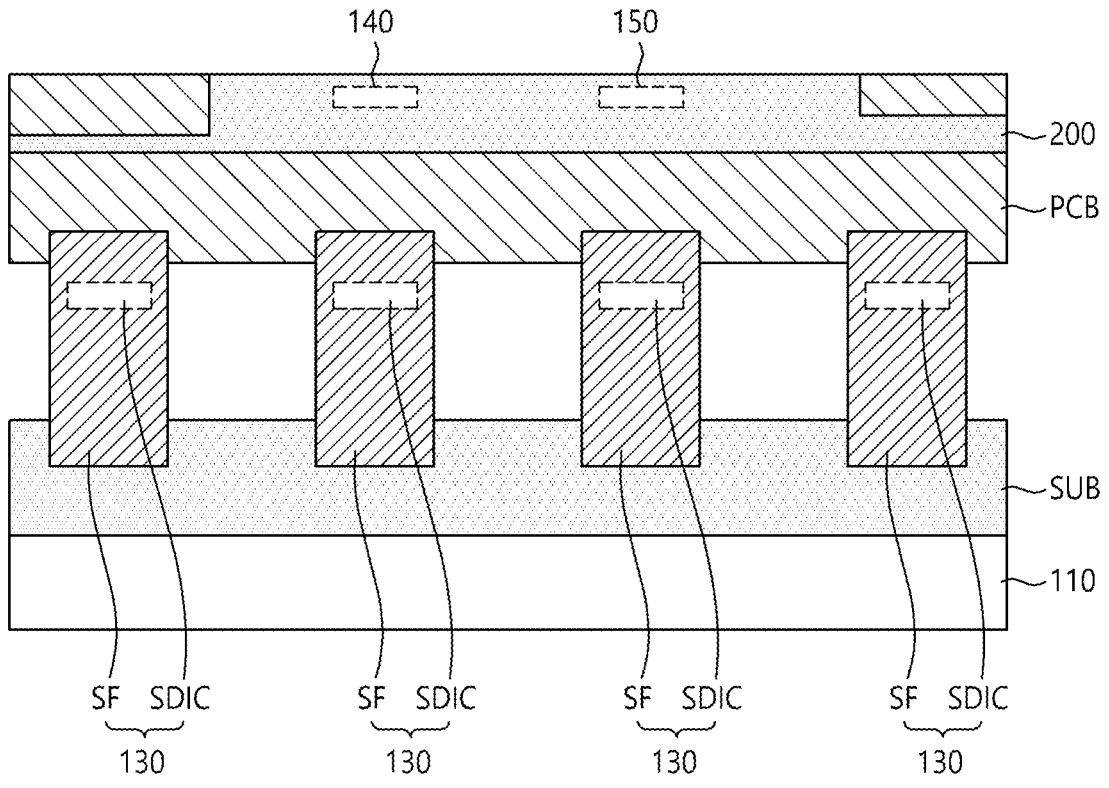
FIG. 2 is a plan view illustrating a display device in which a display panel and a printed circuit board are connected according to embodiments of the present disclosure.

FIG. 2 is a plan view illustrating a display device 100 in which a display panel 110 and a printed circuit board PCB are connected according to embodiments of the present disclosure.

Referring to FIG. 2, the display device 100 may include a substrate SUB, a display panel 11, a data driving circuit 130, a printed circuit board PCB, a controller 140, a power management circuit 150, and a shield can 200.

There may be omitted the descriptions of components in FIG. 2 corresponding to the description in FIG. 1.

The substrate SUB may include a glass component. For example, the substrate SUB may be disposed on a rear surface of the display panel 110. For example, the substrate SUB may be disposed on the opposite surface of the viewing surface of the display panel 110.

The data driving circuit 130 may include a source film SF and a source driving integrated circuit SDIC. The source film SF may be referred to as a chip-on-film (COF). The source drive integrated circuit SDIC may be arranged on the rear surface or a back surface of the source film SF.

An adhesive material may be applied to the rear surface of the source film SF. Accordingly, at least a portion of the substrate SUB and at least a portion of the printed circuit board PCB may be connected by the source film SF.

The data line DL for supplying a voltage supplied from the source drive integrated circuit SDIC to the display panel 110 may be disposed on the source film SF. In addition, a power line for voltage or current supplied from various driving circuits (e.g., a controller 140 or a power management circuit 150) to the display panel 110 may be disposed.

The printed circuit board PCB for circuit connection between the display panel 110 and the driving circuits (e.g., a controller 140, a power management driving circuit 150) may mount various driving circuits.

That is, circuits for driving the display panel 110 may be disposed on the printed circuit board PCB. For example, the controller 140 or the power management circuit 150 may be disposed on the printed circuit board PCB. For example, a shift register may be disposed on the printed circuit board PCB.

The shield can 200 may overlap with circuits for driving the display panel 110 disposed on the printed circuit board PCB. For example, the shield can 200 may cover the controller 140 or the power management circuit 150.

Since the shield can 200 covers the circuits disposed on the printed circuit board PCB, the circuits disposed on the printed circuit board PCB may be protected from external impact, frequency interference, signal interference, and electromagnetic interference. Alternatively, the shield can 200 may be a path for dissipating heat generated from a driving circuit on a printed circuit board PCB.

For example, the controller 140 may be protected from external impact and electromagnetic interference by being placed between the printed circuit board PCB and the shield can 200. For example, the power management circuit 150 may be protected from external impact and electromagnetic interference by being placed between the printed circuit board PCB and the shield can 200.

Figure 3:
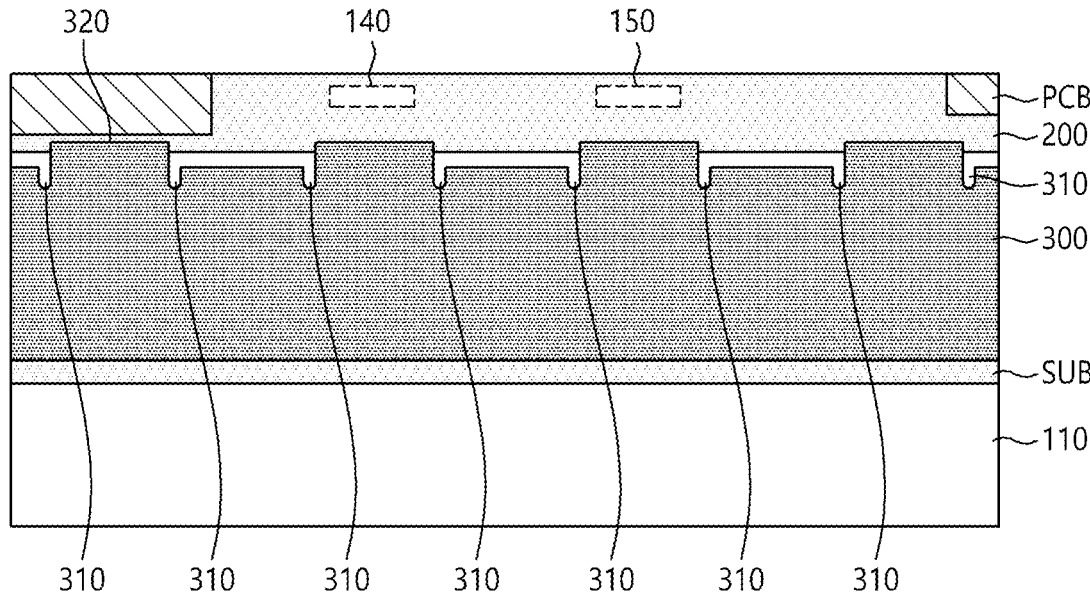
FIG. 3 is a plan view illustrating a display device including a source film, a printed circuit board, and a shield tape overlapping with a shield can according to embodiments of the present disclosure.

FIG. 3 is a plan view illustrating a display device 100 including a source film SF, a printed circuit board PCB, and a shield tape 300 overlapping with a shield can 200 according to embodiments of the present disclosure.

There may be omitted the descriptions of components in FIG. 3 corresponding to the description in FIG. 2.

The shield tape 300 may overlap with at least a portion of the source film SF, the printed circuit board PCB, and the shield can 200. For example, an adhesive material may be applied to the rear surface of the shield tape 300. The shield tape 300 may be attached to other components (e.g., the source film SF, the shield can 200, the substrate SUB, the display panel 110) through the adhesive material applied to the shield tape 300.

For example, the shield tape 300 may be attached to an attachment area of the substrate SUB, the source film SF, at least a portion of the printed circuit board PCB, and at least a portion of the shield can 200.

For example, the shield tape 300 may be attached to the attachment area of the display panel 110, the source film SF, at least a portion of the printed circuit board PCB, and at least a portion of the shield can 200.

In this case, the source film SF may be attached to the pad portion formed on the display panel 110. The power lines (e.g., data line DL, high potential driving voltage line, low potential driving voltage line) disposed on the source film SF may be electrically connected to the display panel 110 through the pad portion.

The shield tape 300 may prevent or at least reduce the occurrence of external electromagnetic interference (EMI) phenomena of components (e.g., source film SF) overlapping with the shield tape 300. The shield tape 300 may protect components overlapping with the shield tape 300 from external force.

The shield tape 300 may include a step portion 310 and a protrusion 320.

At least a portion of the protrusion 320 may overlap with at least a portion of the shield can 200. Accordingly, power lines connected from the shield can 200 to the source film SF may be protected from external electromagnetic interference.

For example, the step portion 310 may be disposed on both sides of the protrusion 320. For example, the step portion 310 may be formed by removing a portion of the shield tape 300.

Since the step portion 310 is formed on both sides of the protrusion 320, it is possible to minimize the tearing of the shield tape due to a step between the printed circuit board PCB and the shield can 200.

Figure 4:
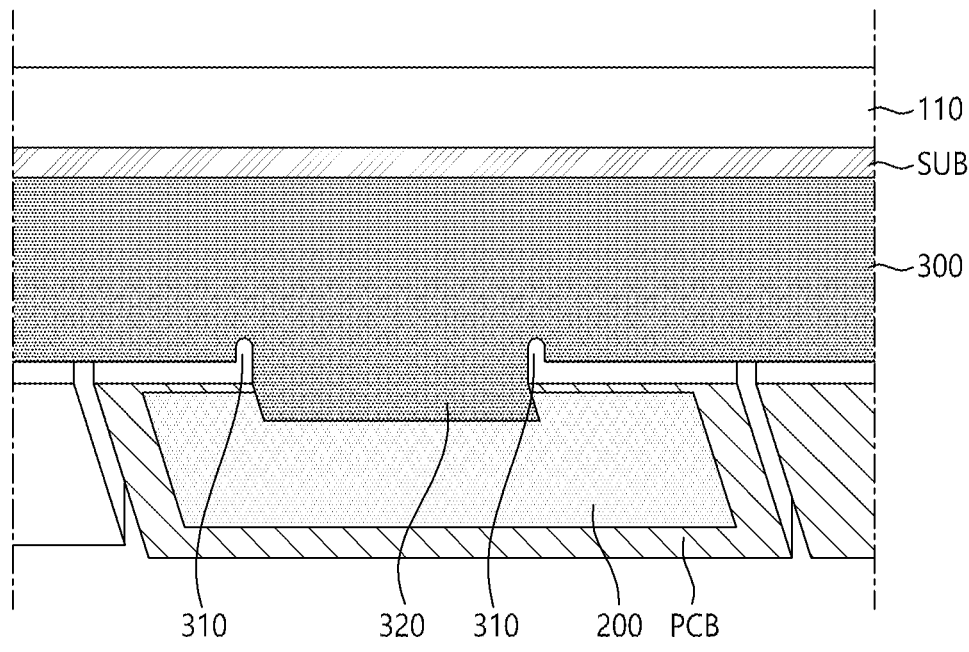
FIG. 4 is a perspective view illustrating a bent display device according to embodiments of the present disclosure.

FIG. 4 is a perspective view illustrating a bent display device 100 according to embodiments of the present disclosure.

The source film SF may be bent in the direction opposite to the rear surface or viewing surface of the display panel 110. Accordingly, various driving circuits (e.g., source driving integrated circuit SDIC, controller 140, and power management circuit 150) connected to the display panel 110 by the source film SF may be disposed on the rear surface or viewing surface of the display panel 110. Since various driving circuits are disposed on the rear surface of the display panel 110, the display device 100 may implement a narrow bezel.

In addition, the shield tape 300 attached to the source film SF may also be bent in the direction opposite to the rear surface or viewing surface of the display panel 110.

Hereinafter, it will be described a display device 100 in which the source film SF and the shield tape 300.

Figure 5:
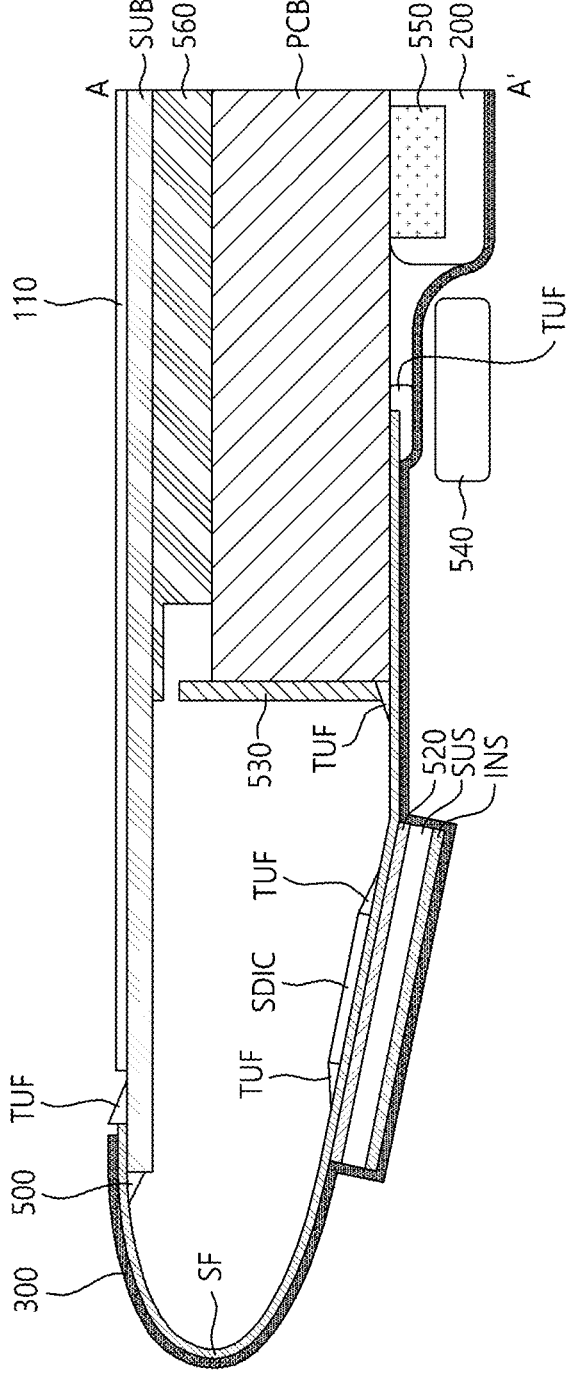
FIG. 5 is a cross-sectional view illustrating a display device connected to other components within an area where a bent source film is located according to embodiments of the present disclosure.

FIG. 5 is a cross-sectional view illustrating a display device connected to other components within an area where a bent source film is located according to embodiments of the present disclosure.

The display device 100 may include a substrate SUB, a display panel 110, a buffer unit TUF, a source film SF, a source driving integrated circuit SDIC, a shield tape 300, a stress dissipation unit 500, an adhesive layer 520, a support unit SUS, an insulating layer INS, a guide unit 530, a contact action unit 540, a shield can 200, a circuit block 550, a printed circuit board PCB, and an attachment unit 560.

There may be omitted the descriptions of components in FIG. 5 corresponding to the description in FIG. 1 to FIG. 4.

The buffer unit TUF may include a resin. The buffer unit TUF may enhance adhesion between the components. The buffer unit TUF may minimize light leakage. The buffer unit TUF may minimize penetration of external substances.

For example, the buffer unit TUF may be disposed in an area where the edge of the substrate SUB and the source film SF are adjacent. For example, the buffer unit TUF may be disposed on the rear surface of the source film SF and may be disposed on the side of the source driving integrated circuit SDIC. Accordingly, at least a portion of the source driving integrated circuit SDIC may be protected. For example, the buffer unit TUF may be arranged in an area where the source film SF, the printed circuit board PCB, and the shield tape 300 are adjacent. In addition, the printed circuit board PCB, the source film SF, and the shield tape 300 may be disposed in an area where the printed circuit board PCB, the source film SF, and the shield tape 300 are adjacent. For example, the buffer unit TUF may be arranged in an area where the guide unit 530, the printed circuit board PCB, and the source film SF are adjacent. Accordingly, it is possible to protect a configuration adjacent to the area where the buffer unit TUF is disposed.

The adhesive layer 520 may be disposed on the upper surface of the source film SF to attach the support unit SUS and the source film SF. The insulating layer INS may be disposed between the support unit SUS and the shield tape 300. The support unit SUS may include a stainless-steel component.

The guide unit 530 may be disposed on the side of the printed circuit board PCB to guide the printed circuit board PCB.

The attachment unit 560 may attach the rear surface of the substrate SUB and the printed circuit board PCB.

The circuit block 550 may be a driving circuit protected by the shield can 200). For example, the circuit block 550 may include at least one driving circuit among the controller 140, the power management circuit 150, and the shift register. In addition, the driving circuit included in the circuit block 550 is not limited to the described examples, and various driving circuits for driving the display device 100 may be included.

The contact action unit 540 may apply an external force to the shield tape 300. For example, as the contact action unit 540 applies an external force, the shield tape 300 may be attached to the shield can 200 and a printed circuit board PCB. The contact action unit 540 may be a structure that applies an external force to the shield tape 300 in the process of combining the rear case to protect components bent to the rear surface of the display panel 110.

As the contact acting unit 540 applies an external force to the shield tape 300, the shield tape 300 may be stressed and torn within the area where there is a step between the shield can 200 and the printed circuit board PCB.

Hereinafter, it will be exemplified the shapes of the step portion 310 and the protrusion 320 of the shield tape 300 to prevent or at least reduce tearing of the shield tape 300.

Figure 6:
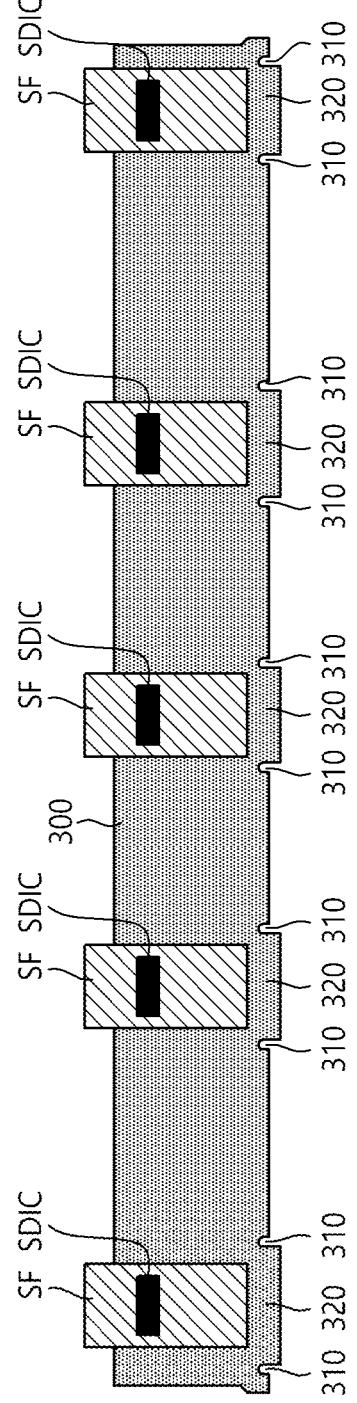
FIG. 6 is a plan view illustrating a rear surface of a shield tape according to embodiments of the present disclosure.

FIG. 6 is a plan view illustrating a rear surface of a shield tape 300 according to embodiments of the present disclosure.

Referring to FIG. 6, the shield tape 300 may have a length to which a plurality of source films SF can be attached. Accordingly, the shield tape 300 may cover a plurality of source films SF on which source drive integrated circuits SDIC are mounted, respectively.

For example, the shield tape 300 may be formed of copper CU. For example, the thickness of the shield tape 300 may be 20 μm.

As described above, the shield tape 300 requires a structure to prevent tearing due to external force.

In order to prevent tearing of the shield tape 300, a step portion 310 may be formed on both sides of the protrusion 320 that receives the most stress due to the step between the shield can 200 and the printed circuit board PCB.

By removing both sides of the protrusion 320 in a predetermined shape, a step portion 310 may be formed. Hereinafter, the protrusion 320 and the step portion 310 can be exemplified.

Figure 7:
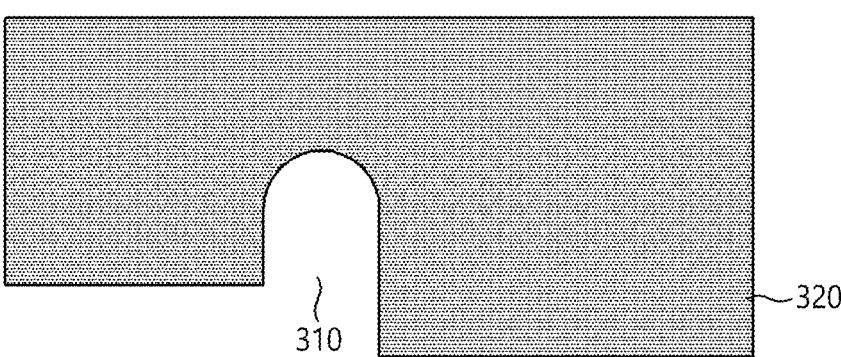
FIG. 7 is a plan view illustrating an enlarged view of a step portion and a protrusion of a shield tape according to embodiments of the present disclosure.

FIG. 7 is an enlarged plan view of the step portion 310 and the protrusion 320 of the shield tape 300 according to embodiments of the present disclosure.

Referring to FIG. 7, the step portion 310 is formed in a round shape on the side of the protrusion 320. By forming the step portion 310 in a round shape, it is possible to maximize the stress dispersion.

However, the step portion 310 is not limited to the exemplified shape, and the step portion 310 may have various shapes such as a square, a triangle, and a chamfer shape for dispersing stress.

In addition to the method of forming the step portion 310, another method may be additionally used to improve the tearing phenomenon of the shield tape 300 due to the step between the shield can 200 and the printed circuit board PCB.

Hereinafter, it will be exemplified a reinforcing member disposed on the rear surface of the shield tape 300.

Figure 8:
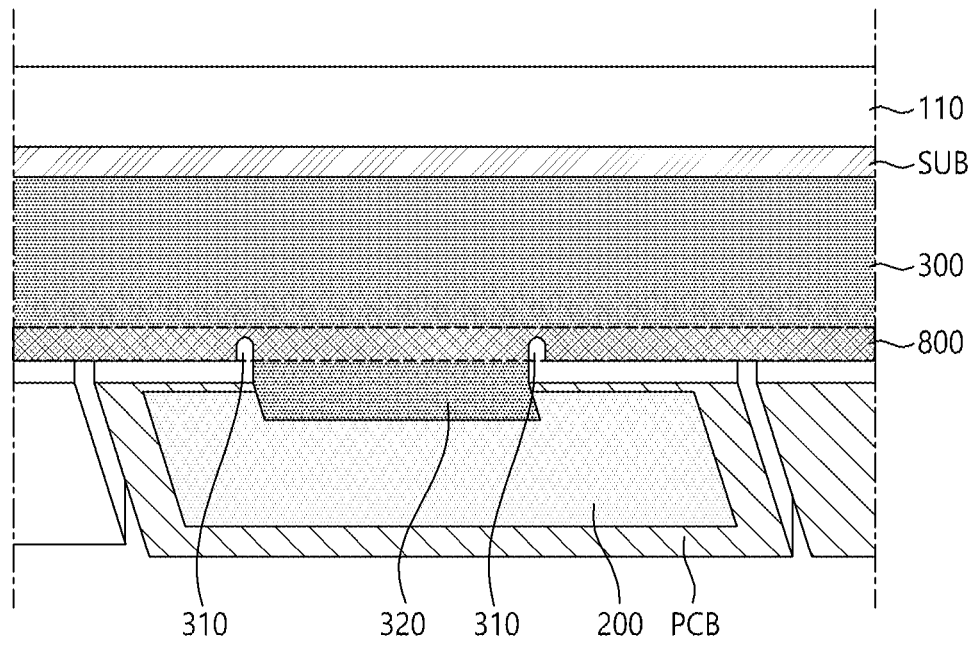
FIG. 8 is a perspective view illustrating a bent display device including a reinforcing member according to embodiments of the present disclosure.

FIG. 8 is a perspective view illustrating a bent display device 100 including a reinforcing member 800 according to embodiments of the present disclosure.

There may be omitted the descriptions of components in FIG. 8 corresponding to the description in FIG. 4.

Referring to FIG. 8, the display device 100 may further include a reinforcing member 800.

The reinforcing member 800 may be overlapped on the rear surface of the shield tape 300 along the length direction of the shield tape 300. Accordingly, the reinforcing member 800 may be disposed between the printed circuit board PCB and the shield tape 300. Alternatively, the reinforcing member 800 may be disposed between the shield can 200 and the shield tape 300.

The reinforcing member 800 may include a PET (Polyethylene Terephthalate) component. For example, the reinforcing member 800 may be formed of PET.

Figure 9:
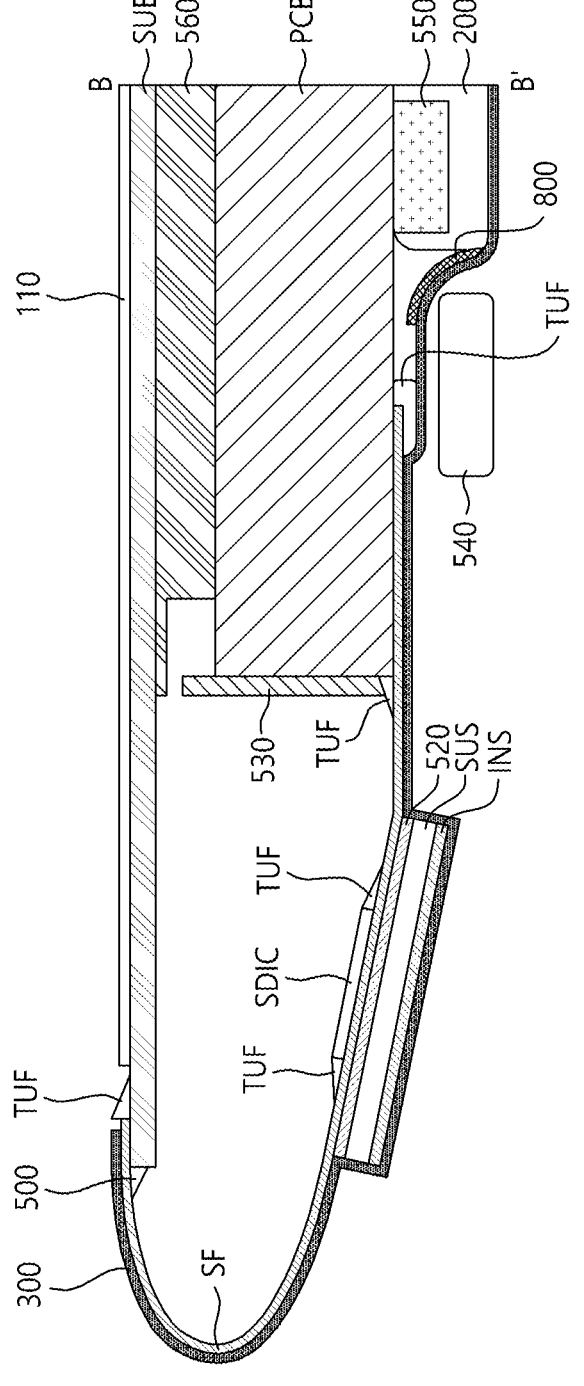
FIG. 9 is a cross-sectional view of a display device connected to other components within an area where a reinforcing member and a bent source film are located according to embodiments of the present disclosure.

FIG. 9 is a cross-sectional view of a display device connected to other components within an area where a reinforcing member and a bent source film are located according to embodiments of the present disclosure.

There may be omitted the descriptions of components in FIG. 9 corresponding to the description in FIG. 5.

Referring to FIG. 9, the reinforcing member 800 may be attached to the rear surface of the shield tape 300 within an area where a step between the shield can 200 and the printed circuit board PCB.

The thickness of the reinforcing member 800 may be smaller than the thickness of the shield tape 300. For example, the thickness of the reinforcing member 800 may be 12 μm.

The reinforcing member 800 may overlap with at least a portion of the printed circuit board PCB and at least a portion of the shield can 200. Accordingly, it is possible to suppress the phenomenon of the shield tape 300 being torn by the stress due to the step.

Figure 10:
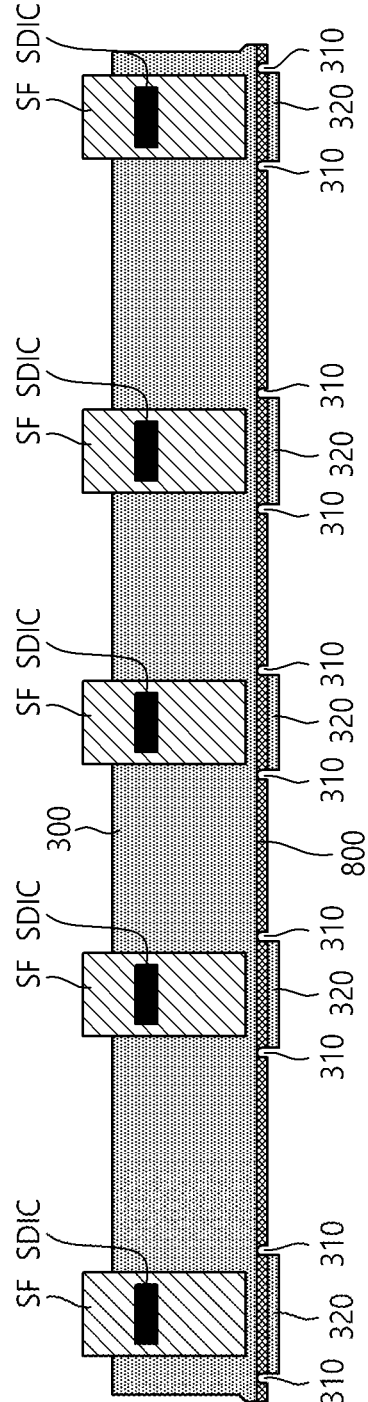
FIG. 10 is a plan view showing a rear surface of a shield tape with an overlapped reinforcing member according to embodiments of the present disclosure.
Figure 11:
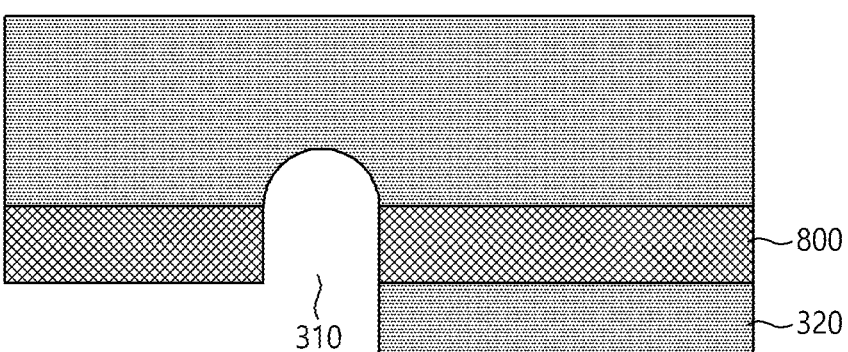
FIG. 11 is an enlarged plan view of a step portion and a protrusion of a shield tape with an overlapped reinforcing member according to embodiments of the present disclosure.

FIG. 10 is a plan view illustrating a rear surface of a shield tape 300 with an overlapped reinforcing member 800 according to embodiments of the present disclosure, and FIG. 11 is an enlarged plan view of a step portion 310 and a protrusion 320 of a shield tape with an overlapped reinforcing member 800 according to embodiments of the present disclosure.

There may be omitted the descriptions of components in FIG. 10 and FIG. 11 corresponding to the description in FIG. 6 and FIG. 7.

Referring to FIG. 10 and FIG. 11, for example, the reinforcing member 800 may be formed in a lower region of the protrusion 320 and may be disposed in at least a portion of the protrusion 320. For example, the reinforcing member 800 may be disposed on both sides of the step portion 310. The lower region may represent at least a portion of the region between the protrusion 320 and the source film SF.

For example, the reinforcing member 800 may not be disposed in at least another portion of the protrusion 320 and may not be disposed in the step portion 310. Alternatively, the reinforcing member 800 may not be disposed in the protrusion 320 and the step portion 310.

Alternatively, the reinforcing member 800 may extend in the longitudinal direction, and may not be attached, and may be disposed only in a lower region of the protrusion 320 between the step portion 310. In this case, it is possible to save the resources required for the reinforcing member 800.

According to the embodiments, the process of forming a stress-resistant shield tape 300 may be optimized based on the process of attaching the reinforcing member 800 to the rear end of the shield tape 300 where the step portion 310 is not formed, and removing the shield tape 300 and the reinforcing member 800 on both sides of the protrusion 320 together.

Since the adhesive material of the plurality of source films SF is exposed inside the display device 100, there may occur problems such as foreign substance attachment, deterioration of insulation performance, short circuit, signal interference, change in electrical characteristics, structural deformation, and destruction by chemicals.

Hereinafter, the structure of the display device 100 is exemplified to solve the problem of exposure of the adhesive material of the source film SF along with improvement of the tearing problem of the shield tape 300.

Figure 12:
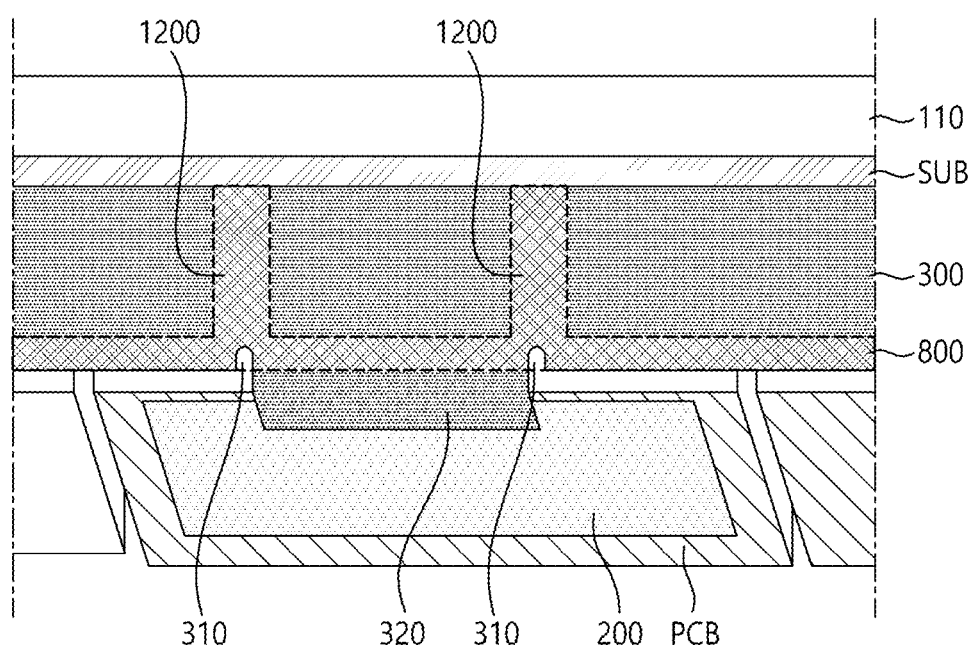
FIG. 12 is a perspective view illustrating a display device including a contamination prevention member and a reinforcing member according to embodiments of the present disclosure.

FIG. 12 is a perspective view illustrating a display device 100 including a contamination prevention member 1200 and a reinforcing member 800 according to embodiments of the present disclosure.

There may be omitted the descriptions of components in FIG. 12 corresponding to the description in FIG. 4 and FIG. 8.

Referring to FIG. 12, the display device 100 may further include a contamination prevention member 1200. The contamination prevention member 1200 may be overlapped on the rear surface of the shield tape 300 along a width direction perpendicular to the length direction of the shield tape 300.

The contamination prevention member 1200 may include the same material as the reinforcing member 800. For example, the contamination prevention member 1200 may be formed of PET.

Figure 13:
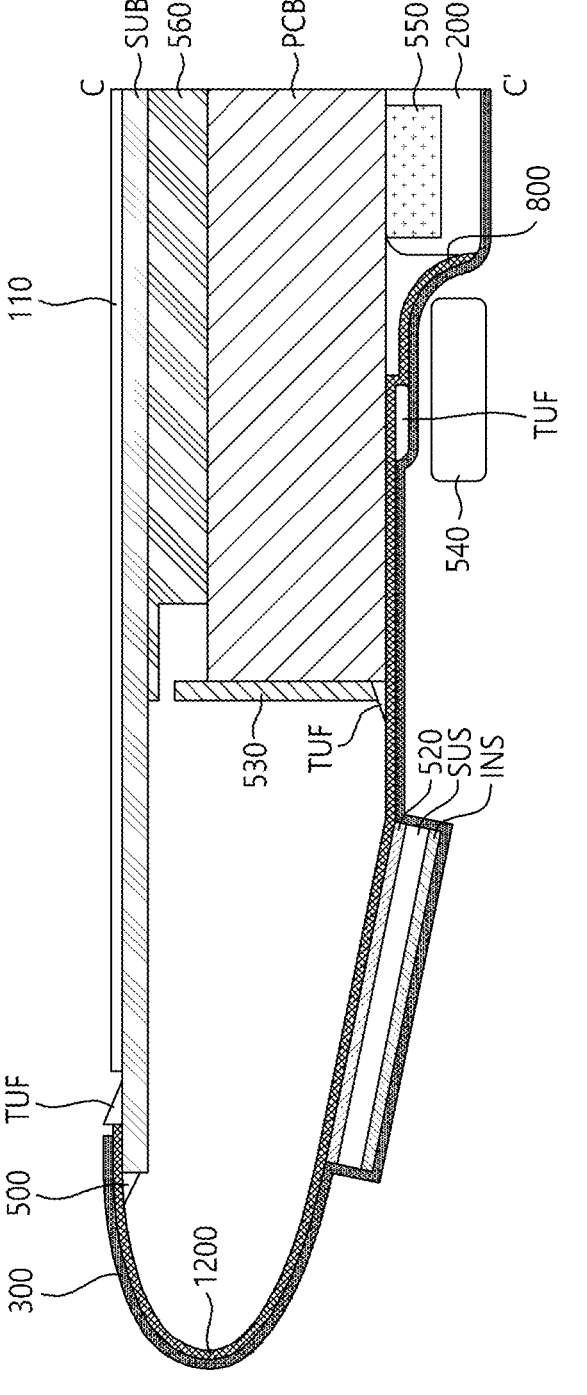
FIG. 13 is a cross-sectional view of a display device connected to other components within an area where a reinforcing member and a bent contamination prevention member are located according to embodiments of the present disclosure.

FIG. 13 is a cross-sectional view of a display device connected to other components within an area where a reinforcing member and a bent contamination prevention member are located according to embodiments of the present disclosure.

There may be omitted the descriptions of components in FIG. 13 corresponding to the description in FIG. 9.

Referring to FIG. 13, the contamination prevention member 1200 may be attached to the rear surface of the shield tape 300 within an area where the source film SF is not disposed.

For example, the contamination prevention member 1200 may be formed spaced apart from the reinforcing member 800. Alternatively, the contamination prevention member 1200 may be formed integrally with the reinforcing member 800.

Since the contamination prevention member 1200 is formed integrally with the reinforcing member 800, the contamination prevention member 1200 and the reinforcing member 800 may be attached integrally to the rear surface of the shield tape 300. Accordingly, the process for exposing the adhesive material of the source film SF and reinforcing the stress of the shield tape 300 may be performed simultaneously.

Figure 14:
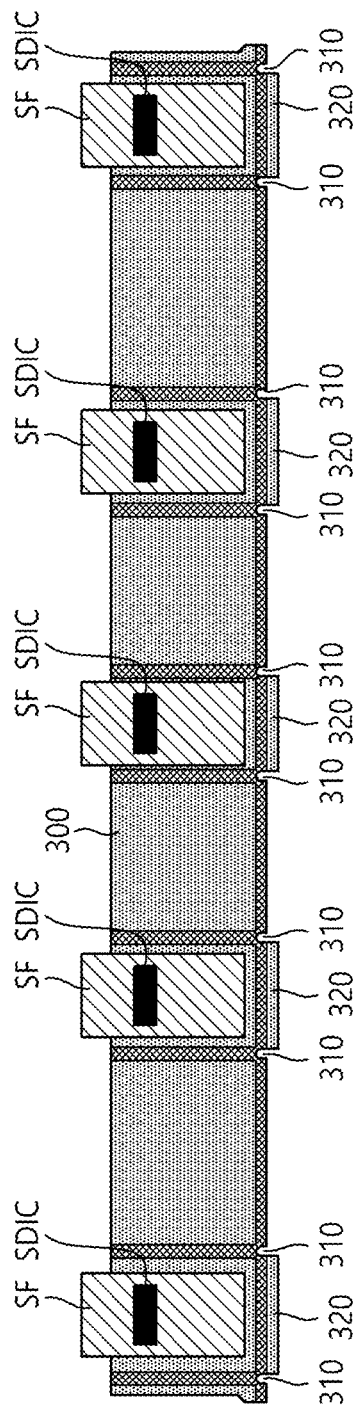
FIG. 14 is a plan view illustrating a rear surface of a shield tape including a contamination prevention member and a reinforcing member according to embodiments of the present disclosure.
Figure 15:
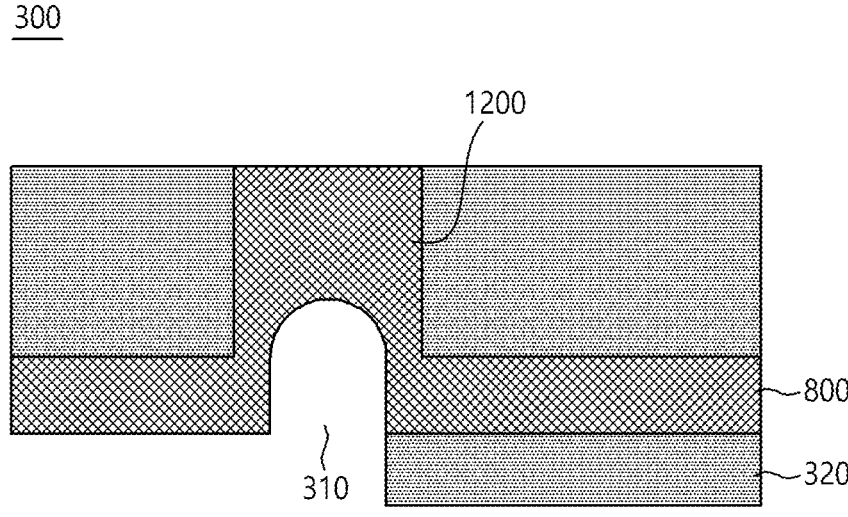
FIG. 15 is an enlarged plan view illustrating a shield tape with an overlapped contamination prevention member and an overlapped reinforcing member according to embodiments of the present disclosure.

FIG. 14 is a plan view illustrating a rear surface of a shield tape 300 including a contamination prevention member 1200 and a reinforcing member 800 according to embodiments of the present disclosure, and FIG. 15 is an enlarged plan view illustrating a shield tape 300 with an overlapped contamination prevention member 1200 and an overlapped reinforcing member 800 according to embodiments of the present disclosure.

There may be omitted the descriptions of components in FIG. 14 and FIG. 15 corresponding to the description in FIG. 6, FIG. 7, FIG. 11, and FIG. 12.

Referring to FIG. 14 and FIG. 15, the contamination prevention member 1200 may be disposed on both sides of the source film SF. Accordingly, it is possible to prevent the phenomenon of adhesive materials being exposed between a plurality of source films SF.

Referring to FIG. 14, the source film SF is illustrated as being arranged between the step portions 310, but the location of the source film SF is not limited thereto. However, regardless of the arrangement of the source film SF, the contamination prevention member 1200 may be disposed at a predetermined interval on both sides of the source film SF in order to prevent the exposure of the adhesive material of the source film SF.

For example, the contamination prevention member 1200 may not be disposed on the protrusion 320 and the step portion 310.

Accordingly, it is possible to optimize a process of forming a shield tape 300 that is robust to stress and resistant to exposure of the adhesive material of the source film SF by using the process of attaching a contamination prevention member 1200 formed integrally with a reinforcing member 800 to the back surface of a shield tape 300 and removing the reinforcing member 800 and contamination prevention member 1200 overlapping with the area where the step portion 310 is to be formed.

A display device according to embodiments of the present disclosure may be briefly described as follows.

A display device according to embodiments of the present disclosure may include a display panel on which a plurality of subpixels are disposed and an image is displayed, a source driving integrated circuit that supplies a data voltage to the plurality of subpixels, a source film connected to the display panel and on which the source driving integrated circuit is disposed, a printed circuit board that overlaps with at least a portion of the source film, a circuit block that is disposed on the printed circuit board and controls a voltage or current for driving the display panel, a shield can that overlaps with the printed circuit board and the circuit block, and a shield tape that overlaps with the source film, at least a portion of the printed circuit board, and at least a portion of the shield can and protects the source film.

The shield tape may include a protrusion overlapping with at least a portion of the shield can, and a step portion formed on both sides of the protrusion to distribute stress.

The circuit block may include a controller for controlling the source driving integrated circuit, or the source driving integrated circuit, or a power management circuit for controlling a voltage or current to be supplied to the display panel.

The step portion may be formed in a round shape.

The display device may further include a reinforcing member overlapping with a rear surface of the shield tape along a length direction of the shield tape The reinforcing member may be not disposed on at least a portion of the protrusion and the step portion.

The display device may further include a contamination prevention member which overlaps with a rear surface of the shield tape along a width direction perpendicular to a length direction of the shield tape and is disposed on both sides of the source film.

The contamination prevention member may be not disposed on the step portion and the protrusion.

The reinforcing member and the contamination prevention member may be formed integrally.

The shield tape may include copper.

The reinforcing member and the contamination prevention member may include polyethylene terephthalate (PET).

A display device according to embodiments of the present disclosure may include a display panel on which a plurality of subpixels are disposed and an image is displayed, a source driving integrated circuit that supplies a data voltage to the plurality of subpixels, a source film connected to the display panel and on which the source driving integrated circuit is disposed, a printed circuit board that overlaps with at least a portion of the source film, a circuit block that is disposed on the printed circuit board and controls a voltage or current for driving the display panel, a shield can that overlaps with the printed circuit board and the circuit block, a shield tape that overlaps with at least a portion of the shield can and the source film and protects the source film, and a reinforcing member that overlaps with a rear surface of the shield tape along a length direction of the shield tape.

The circuit block may include a controller for controlling the source driving integrated circuit, or the source driving integrated circuit, or a power management circuit for controlling a voltage or current to be supplied to the display panel.

The shield tape may include a protrusion overlapping with at least a portion of the shield can, and a step portion formed on both sides of the protrusion to distribute stress.

The step portion may be formed in a round shape.

The reinforcing member may be not disposed on at least a portion of the protrusion and the step portion.

The display device may further include a contamination prevention member which overlaps with the rear surface of the shield tape along a width direction perpendicular to the length direction of the shield tape and is disposed on both sides of the source film.

The contamination prevention member may be not disposed on the step portion and the protrusion.

The reinforcing member and the contamination prevention member may be formed integrally.

The shield tape may include copper.

The reinforcing member and the contamination prevention member may include polyethylene terephthalate (PET).

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

What is claimed is:

1. A display device comprising:
a display panel on which a plurality of subpixels are disposed and an image is displayed;
a source driving integrated circuit that supplies a data voltage to the plurality of subpixels;
a source film connected to the display panel and on which the source driving integrated circuit is disposed;
a printed circuit board that overlaps at least a portion of the source film;
a circuit block that is disposed on the printed circuit board and controls a voltage or a current that drives the display panel;
a shield can that overlaps the printed circuit board and the circuit block; and
a shield tape that overlaps the source film, at least a portion of the printed circuit board, and at least a portion of the shield can, the shield tape protecting the source film,
wherein the shield tape includes:
a protrusion overlapping at least a portion of the shield can, and
a step portion on both sides of the protrusion, the step portion distributing stress.

2. The display device of claim 1, wherein the circuit block includes a controller configured to control the source driving integrated circuit, or the source driving integrated circuit, or a power management circuit configured to control a voltage or current to be supplied to the display panel.

3. The display device of claim 1, wherein the step portion has a round shape.

4. The display device of claim 1, further comprising:
a reinforcing member overlapping a rear surface of the shield tape along a length direction of the shield tape.

5. The display device of claim 4, wherein the reinforcing member is not disposed on at least a portion of the protrusion and the step portion.

6. The display device of claim 5, further comprising:
a contamination prevention member that overlaps a rear surface of the shield tape along a width direction perpendicular to a length direction of the shield tape and is disposed on both sides of the source film.

7. The display device of claim 6, wherein the contamination prevention member is not disposed on the step portion and the protrusion.

8. The display device of claim 6, wherein the reinforcing member and the contamination prevention member are integral with each other.

9. The display device of claim 6, wherein the shield tape includes copper, and the reinforcing member and the contamination prevention member include polyethylene terephthalate (PET).

10. A display device comprising:
a display panel on which a plurality of subpixels are disposed and an image is displayed;
a source driving integrated circuit that supplies a data voltage to the plurality of subpixels;
a source film connected to the display panel and on which the source driving integrated circuit is disposed;
a printed circuit board that overlaps at least a portion of the source film;
a circuit block that is disposed on the printed circuit board and controls a voltage or a current that drives the display panel;
a shield can that overlaps the printed circuit board and the circuit block;
a shield tape that overlaps at least a portion of the shield can and the source film, the shield tape protecting the source film; and
a reinforcing member that overlaps a rear surface of the shield tape along a length direction of the shield tape.

11. The display device of claim 10, wherein the circuit block includes a controller configured to control the source driving integrated circuit, or the source driving integrated circuit, or a power management circuit configured to control a voltage or a current to be supplied to the display panel.

12. The display device of claim 10, wherein the shield tape includes:
a protrusion overlapping at least a portion of the shield can, and
a step portion on both sides of the protrusion, the step portion distributing stress.

13. The display device of claim 12, wherein the step portion has a round shape.

14. The display device of claim 12, wherein the reinforcing member is not disposed on at least a portion of the protrusion and the step portion.

15. The display device of claim 12, further comprising:
a contamination prevention member that overlaps the rear surface of the shield tape along a width direction perpendicular to the length direction of the shield tape and is disposed on both sides of the source film.

16. The display device of claim 15, wherein the contamination prevention member is not disposed on the step portion and the protrusion.

17. The display device of claim 15, wherein the reinforcing member and the contamination prevention member are integral with each other.

18. The display device of claim 17, wherein the shield tape includes copper, and the reinforcing member and the contamination prevention member include polyethylene terephthalate (PET).

\* \* \* \* \*